(12) United States Patent
Ikuhara et al.

(10) Patent No.: US 7,374,613 B2
(45) Date of Patent: May 20, 2008

(54) SINGLE CRYSTAL MATERIAL HAVING HIGH DENSITY DISLOCATIONS ARRANGED ONE-DIMENSIONALLY IN STRAIGHT LINE FORM, FUNCTIONAL DEVICE USING SAID SINGLE CRYSTAL MATERIAL, AND METHOD FOR THEIR PREPARATION

(75) Inventors: Yuichi Ikuhara, Tokyo (JP); Takahisa Yamamoto, Chiba (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 338 days.

(21) Appl. No.: 10/511,684

(22) PCT Filed: Apr. 21, 2003

(86) PCT No.: PCT/JP03/05062

§ 371 (c)(1),
(2), (4) Date: May 26, 2005

(87) PCT Pub. No.: WO03/089698

PCT Pub. Date: Oct. 30, 2003

(65) Prior Publication Data
US 2005/0217563 A1    Oct. 6, 2005

(30) Foreign Application Priority Data
Apr. 19, 2002 (JP) .............................. 2002-117629

(51) Int. Cl.
C30B 1/00 (2006.01)
C30B 31/00 (2006.01)
H01L 29/04 (2006.01)

(52) U.S. Cl. .................. 117/7; 117/3; 117/4; 117/6; 117/950; 257/9; 257/14

(58) Field of Classification Search .................... 117/7, 117/3, 4, 6, 950; 257/9, 14
See application file for complete search history.

(56) References Cited

OTHER PUBLICATIONS

Nakamura et al., "Dislocation Structure in Compressed A-Al2O3 single crystals", Annual Report of Engineering Research Institute School of Engineering, University of Tokyo, vol. 59, p. 154-164 (2000).*

(Continued)

*Primary Examiner*—Robert Kunemund
*Assistant Examiner*—Matthew J Song
(74) *Attorney, Agent, or Firm*—Westerman, Hattori, Daniels & Adrian, LLP.

(57) ABSTRACT

Disclosed is a ceramic or metal single-crystal material having high-density dislocations arranged one-dimensionally on respective straight lines. The single-crystal material is produced by compressing a ceramic or metal single-crystal blank at a high temperature from a direction allowing the activation of a single slip to induce plastic deformation therein, and then subjecting the resulting product to a heat treatment. The single-crystal material can be used in a device for high-speed dislocation-pipe diffusion of ions or electrons. The single-crystal material can further be subjected to a diffusion treatment so as to diffuse a metal element from its surface along the dislocations to provide a single-crystal device with a specific electrical conductivity or a quantum wire device. Otherwise, the single-crystal material can be subjected to annealing or chemical etching so as to form nano-holes along the high-density dislocations to provide a thin film device, such as a molecular sieve film or a carbon-dioxide separating film.

4 Claims, 4 Drawing Sheets

QUANTUM WIRE BUNDLE

OTHER PUBLICATIONS

Nakamura et al., English Translation of "Dislocation Structure in Compressed A-Al2O3 single crystals", Annual Report of Engineering Research Institute School of Engineering, University of Tokyo, vol. 59, p. 159-164 (2000), pp. 1-16.*

A. Nakamura et al.; Tokyo Daigaku Kogakubu Sogo Shinkensho Nenpo, vol. 59, pp. 159-164, 2.experimental method, Oct. 2000. Partial English translation. Cited in the international search report.

A. Nakamura et al.; Nihon Ceramics Kyokai, Dai 20 Kai Koon Zairyo Kiso Toronkai Koen Yoshishu, pp. 48-50, Oct. 25, 2001. Partial English translation. Cited in the international search report.

Patent Abstracts of Japan, Publication No. 05-218391, dated Aug. 27, 1993. Cited in specification.

Patent Abstracts of Japan, Publication No. 11-026888, dated Jan. 29, 1999. Cited in the specification.

* cited by examiner

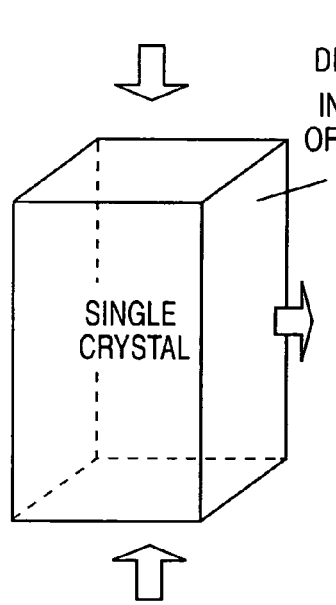
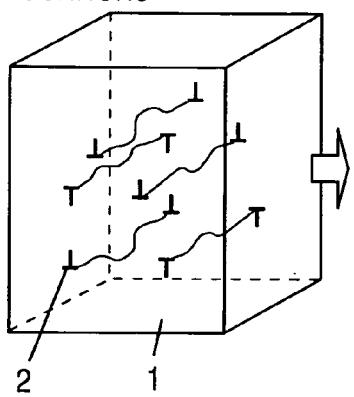
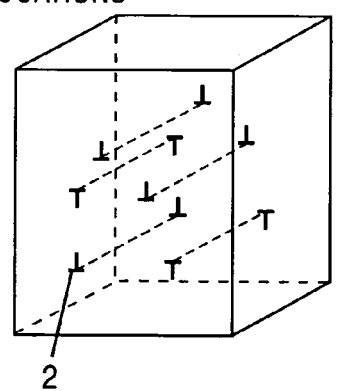
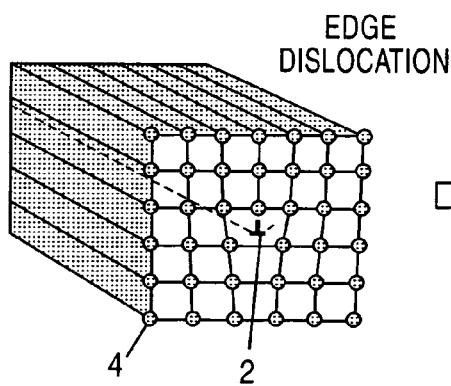
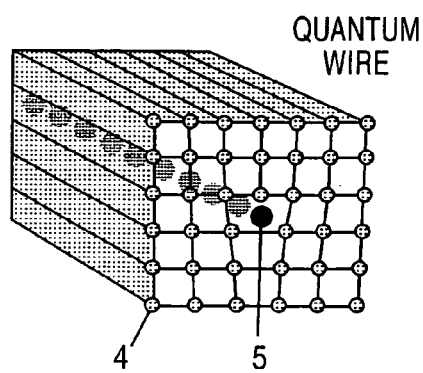

T DISLOCATION
⊕ METAL ATOM

QUANTUM WIRE BUNDLE

SINGLE CRYSTAL MATERIAL HAVING HIGH DENSITY DISLOCATIONS ARRANGED ONE-DIMENSIONALLY IN STRAIGHT LINE FORM, FUNCTIONAL DEVICE USING SAID SINGLE CRYSTAL MATERIAL, AND METHOD FOR THEIR PREPARATION

TECHNICAL FIELD

The present invention relates to a ceramic or metal single-crystal material having high-density dislocations arranged one-dimensionally on respective straight lines, a functional device using the single-crystal material, and methods of producing them.

BACKGROUND ART

A solid material, such as ceramics or metals, includes a portion where micro-regions with a disordered atomic arrangement continuously align in a line. This portion is referred to as "dislocation"). The dislocation is classified broadly into "edge dislocation" and "screw dislocation". These dislocations are formed, for example, during the course of solidification of a molten material or in conjunction with plastic deformation of a solid material. If the density of dislocations in a material is increased, the material can have an enhanced strength.

A structure adapted to two-dimensionally confine electrons and allow only one-dimensional electron motion is known and described as a quantum wire. As one of the attempts to utilize a dislocation mechanism for the production of the quantum wire, there has been known a method intended to utilize an energy level to be formed along misfit dislocations generated in the hetero-phase interface between a single-crystal substrate and a single-crystal film which is placed on a limited surface region of the substrate and prepared to have a lattice constant different by about 0.2% to 5% relative to that of the substrate (Japanese Patent Laid-Open Publication No. 05-218391). There has also been known a method intended to apply a stress to a quantum well so as to generate a dislocation phenomenon (Japanese Patent Laid-Open Publication No. 11-026888).

DISCLOSURE OF INVENTION

Heretofore, various academic researches on dislocations in crystal material have been vigorously made to clarify the structure, generation mechanism and motion mechanism thereof. The resulting dislocation theory has played a key role in clarifying or ascertaining material technologies, such as deformation processing and the mechanism for strength development. However, in view of industrial application, the dislocation mechanism has been limitedly utilized, for example, as means for improving the strength of structural materials. It is therefore an object of the present invention to develop a nanotechnology, such as quantum wire, utilizing the dislocations in solid crystal.

The inventors have found that a ceramic or metal single-crystal blank can be compressed from a direction allowing the activation of a single slip at a high temperature to introduce high-density dislocations therein and then subjected to a heat treatment, so as to allow the high-density dislocations to be one-dimensionally arranged on respective straight lines in the single-crystal blank, and a functional device can be produced through the use of this method.

Specifically, firstly, the present invention provides a single-crystal material made of ceramic or metal, which internally has dislocations arranged one-dimensionally on respective straight lines at a high density of $10^6$ to $10^{14}/cm^2$.

Secondly, the present invention provides a device for high-speed dislocation-pipe diffusion of ions or electron, comprising the above single-crystal material.

Thirdly, the present invention provides a quantum wire device comprising a single-crystal material made of ceramic or metal, which has dislocations arranged one-dimensionally on respective straight lines at a high density of $10^6$ to $10^{14}/cm^2$, and quantum wires consisting of metal atoms introduced in the single-crystal material through a diffusion treatment. The quantum wires are arranged along the corresponding dislocations at a high density of $10^6$ to $10^{14}/cm^2$.

Fourthly, the present invention provides a thin film device comprising a single-crystal thin film made of ceramic or metal, which internally has dislocations arranged one-dimensionally on respective straight lines at a high density of $10^6$ to $10^{14}/cm^2$, and nano-hole bundles formed along the corresponding dislocations.

Fifthly, the present invention provides a method of producing a single-crystal material made of ceramic or metal, which internally has dislocations arranged one-dimensionally on respective straight lines at a high density of $10^6$ to $10^{14}/cm^2$. The method comprises compressing a single-crystal blank made of ceramic or metal, from a direction allowing the activation of a single slip, in a temperature range of a brittle-to-ductile transition temperature (BDTT) to about a melting point of the single-crystal blank to induce plastic deformation therein, and subjecting the resulting product to a heat treatment at a high temperature of one-half or more of the melting point by absolute temperature.

Sixthly, the present invention provides a method of producing a single-cristal material for a quantum wire device. The method comprises: compressing a single-crystal blank made of ceramic or metal, from a direction allowing the activation of a single slip, in a temperature range of a brittle-to-ductile transition temperature to about a melting point of the single-crystal blank to induce plastic deformation therein, and subjecting the resulting product to a heat treatment at a high temperature of one-half or more of the melting point by absolute temperature, to provide a single-crystal material internally having dislocations arranged one-dimensionally on respective straight lines at a high density of $10^6$ to $10^{14}/cm^2$; and subjecting the single-crystal material to a diffusion treatment to diffuse metal atoms from the surface of the single-crystal material to form quantum wires arranged along the corresponding dislocations at a high density of $10^6$ to $10^{14}/cm^2$.

Seventhly, the present invention provides a method of producing a single-cristal material for a thin film device. The method comprises: compressing a single-crystal blank made of ceramic or metal, from a direction allowing the activation of a single slip, in a temperature range of a brittle-to-ductile transition temperature to about a melting point of the single-crystal blank to induce plastic deformation therein, and subjecting the resulting product to a heat treatment at a high temperature of one-half or more of the melting point by absolute temperature, to provide a single-crystal internally having dislocations arranged one-dimensionally on respective straight lines at a high density of $10^6$ to $10^{14}/cm^2$; and subjecting the single-crystal to annealing or chemical etching to form nano-hole bundles along the corresponding dislocations.

BRIEF DESCRIPTION OF DRAWINGS

FIG. 1 is a schematic conceptual explanatory diagram of a method of the present invention.

FIG. 2(a) is a schematic diagram showing an edge dislocation formed in a crystal.

FIG. 2(b) is a schematic diagram showing the state after additional metal elements are bonded to the edge dislocation.

BEST MODE FOR CARRYING OUT THE INVENTION

FIG. 1 is a schematic conceptual explanatory diagram of a method of producing a single-crystal material made of ceramic or metal, according to the present invention. As shown in FIG. 1(a), a single-crystal blank I made of ceramic or metal is compressed at a high temperature using a compression testing machine, such as a hydraulic servo type, a ball-screw drive type or an AC servomotor type to have a compression strain of 1 to 50% so as to induce plastic deformation therein. The term "high temperature" herein means a temperature ranging from a brittle-to-ductile transition temperature (BDTT), or a lower-limit temperature allowing dislocations to be introduced in a single-crystal blank, to about a melting point of the single-crystal blank. Specifically, while this temperature range is from 1050 to 2040° C. for alumina, from 650 to 2500° C. for zirconia, and from 200 to 2770° C. for magnesia, a metal allows plastic deformation to be sufficiently induced even at room temperatures so as to generate dislocations therein. Generally, the limiting point of a compression forming of the blank is about 50% by compression strain. If the compression strain goes beyond this value, some dislocations will penetrate a crystal face to preclude the density of dislocations from increasing.

While the following description will be made in connection of an example where edge dislocations are formed, the same process may be used, in principle, to form high-density screw dislocations arranged one-dimensionally on respective straight lines.

In order to introduce dislocations one-dimensionally at high density, it is requited to compress a single-crystal blank from a direction allowing the principal slip system (primary slip system) to be activated. The principal slip system is varied depending on the type of crystal. For example, it is (001) face for zirconia, and (0001) face for alumina. Further, the single-crystal blank has to be compressed such that a shear stress acts along a slip plane. Thus, a compression axis is selectively determined in such a manner that the angle between the normal line relative to the principal slip plane and the compression axis falls within 45°±30°. When the compression is performed in this angle rang, the principal slip system can be activated to introduce dislocations having a one-dimensional orientation, on the slip plane.

Figure 5A:
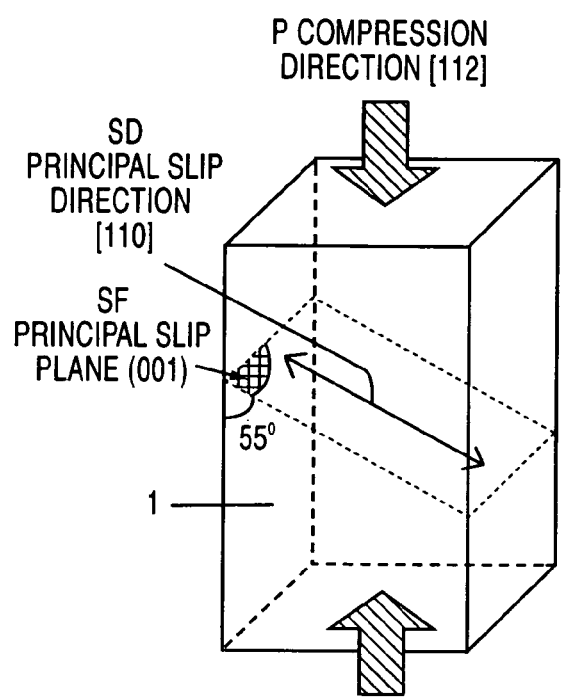
FIG. 5(a) is a schematic diagram showing a compression method in Example 1.
Figure 5B:
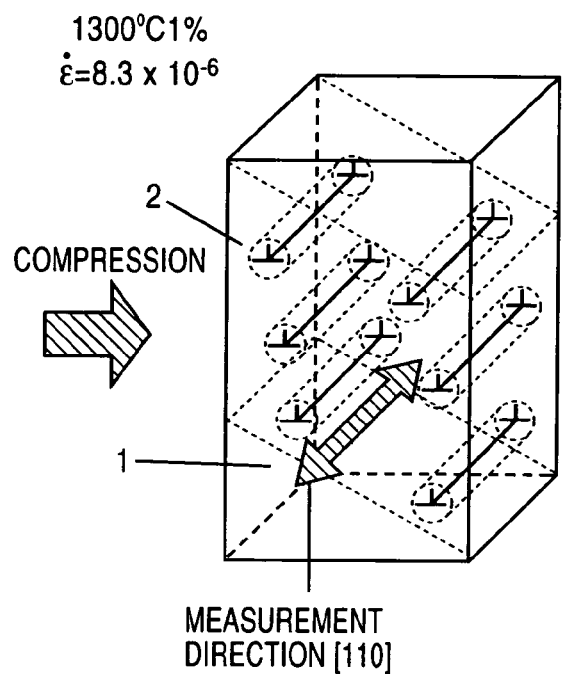
FIG. 5(b) is a schematic diagram showing edge dislocations introduced by a heat treatment performed after compression.

FIG. 5(a) is a schematic diagram showing a compression test of a cubic zirconia single crystal. In this test, the compression axis is set in the [112] orientation, and at 35° with the (001) face serving as the slip plane. This angle falls within the aforementioned angle range. As shown in FIG. 5(b), when a single-crystal blank or test piece is compressed from this direction, dislocations having a one-directional orientation (while curved edge dislocations are actually introduced as shown in FIG. 1(b), they will be linearly reformed through a heat treatment to be subsequently performed at a high temperature, as shown in FIG. 1(c)) can be introduced in the test piece. This technique can be applied to any ceramic and metal so far as they are plastically deformable.

Then, the above test piece is subjected to a heat treatment at a high temperature allowing effective atomic diffusion. As shown in FIG. 1(c), through this heat treatment, the edge dislocations are changed into one-dimensional straight dislocations arranged at a high density of $10^7/cm^2$ or more. In the heat treatment, the temperature may be specifically set at 800° C. or more for alumina, 1100° C. for zirconia, and 1250° C. for magnesia. The straightening of the dislocations through the heat treatment can be explained by the reason that the dislocations themselves have a line tension, and the linear state is more advantageous than the curved state in terms of energetic aspects.

A single-crystal material produced through the above method has edge dislocations arranged at a high density and on respective straight lines. Thus, the single-crystal material can be used as a device utilizing high-speed dislocation-pipe diffusion of ions or electrons. The dislocation-pipe diffusion means atomic diffusion along a dislocation center. As compared with lattice diffusion, the dislocation-pipe diffusion has an incredibly larger diffusion coefficient. In view of a higher diffusion rate than that of the lattice diffusion, the dislocation-pipe diffusion is referred to as "high-speed dislocation-pipe diffusion".

FIG. 2 is a schematic diagram showing an edge dislocation 2 formed in a crystal lattice 4 of a single crystal material. FIG. 2(b) is a schematic diagram showing the state after additional metal elements 5 are bonded to the edge dislocation through a diffusion treatment. While a metal to be diffused along the dislocation center includes a metal unlikely to form a compound in cooperation with a matrix single crystal, and a metal having an ionic radius equal to or less than two-times of a positive ion in the matrix, such as Ti, Ni, Ag, Cu, Fe, Zn, Mg and Be, any other suitable metal may be used.

The additional metal may be added as follows. One selected from the above metals is first deposited on the surface of the single-crystal material having the high-density dislocations through a vacuum deposition process or the like. The deposited metal is then heated in a vacuum or inert gas atmosphere to cause diffusion along the dislocation center or the dislocation-pipe diffusion. This heating temperature is selectively determined at a value greater than one-half of the melting point of the selected metal.

When the additional metal elements are diffused along and in a direction parallel to the edge dislocations, the diffusion along the dislocations is performed at a high speed to allow atoms with a larger size to be adequately defused, because the single-crystal material formed with the edge dislocations 2 has some disorder in the atomic arrangement along the dislocations, and the dislocations are arranged at a high density and on respective straight lines, as shown in FIG. 2(b). The metal elements arranged along the corresponding edge dislocations make it possible to provide a single-crystal device having a unique or specific electrical conductivity.

Figure 3:
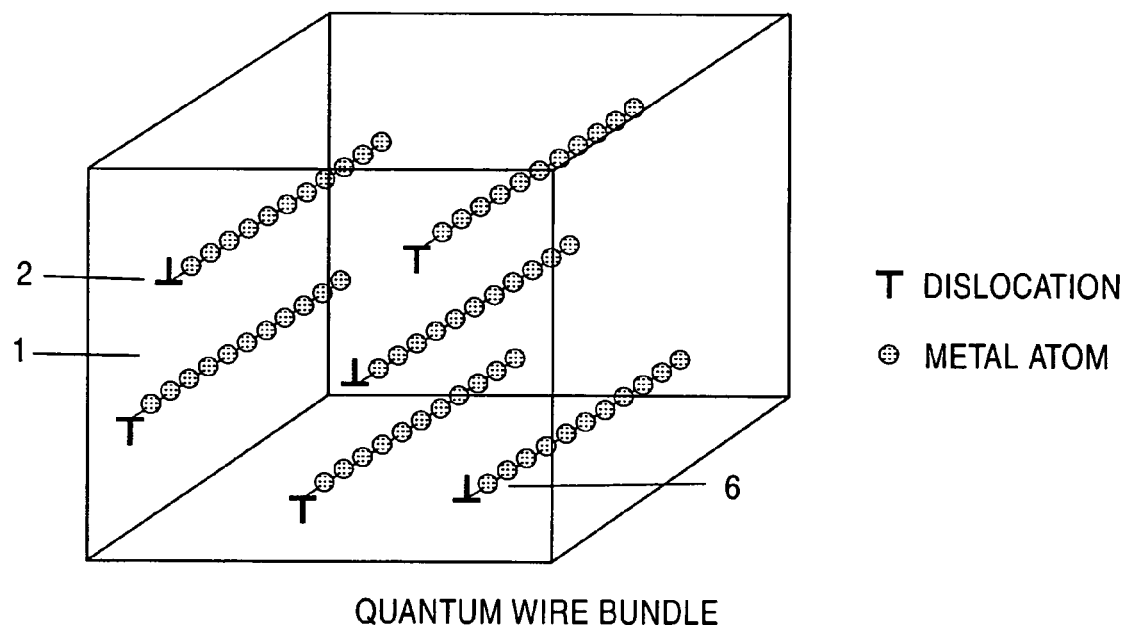
FIG. 3 is a schematic diagram showing quantum wires arranged at a high density, which consist of metal atoms introduced by diffusing metal elements along edge dislocations in a single-crystal material.

The above method can also be utilized to produce a quantum wire. Specifically, as shown in FIG. 3, metal atoms 6 are introduced from the surface to the inside of the single-crystal material 1 along the edge dislocations 2 through a diffusion treatment. While the metal is readily diffused in the single-crystal material along the edge dislocations which is a disordered atomic arrangement, it is difficult to diffuse over the remaining portion. Thus, the quantum wire can be formed of a number of metal atoms 6 and aligned at a high density.

In a conventional quantum wire device, all quantum wires are formed only in a solid surface. Thus, the volume fraction of the quantum wires is extremely low, which leads to difficulties in using it as a solid device. Moreover, the quantum wires formed in the solid surface exhibit electron properties affected by a portion in contact with the surface and a portion exposed to outside.

By contrast, in the quantum wire device of the present invention, all of quantum wires can be embedded in a solid crystal, and thereby the interface between the solid crystal and each of the quantum wires contributes to exhibiting electron properties. Thus, it can be expected to develop a number of quantum wire devices having a revolutionary function by variously altering the type of the single crystal material and/or the type of the additional metal.

Figure 4:
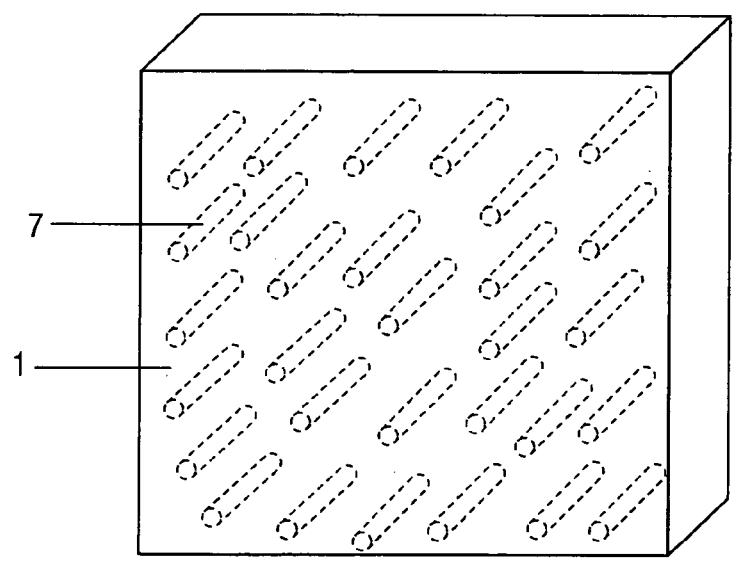
FIG. 4 is a schematic diagram showing a thin film device which comprises a single-crystal thin film having nano-hole bundles formed by selectively etching edge dislocations through annealing or chemical etching.

Furthermore, as shown in FIG. 4, the edge dislocations may be subjected to selective etching based on annealing or chemical etching.

A portion adjacent to the center of each of the edge dislocations has a larger volume than that of the surrounding portion thereof. In other words, there is a nano-order hole around the center of the edge dislocation. While the size of the hole is dependent of that of Burgers vector, the hole has generally a diameter of about several angstroms. Further, the edge dislocation may be subjected to a heat treatment at a temperature equal to or less than one-half of the melting point of the crystal to etch the hole so as to provide an increased diameter. Otherwise, the crystal may be immersed in a chemical etchant, such as molten KOH to etch the hole so as to controllably increase the diameter of the hole along the dislocation. This hole is referred to as "nano-hole". A thin film or thick film formed with nano-hole bundles can be produced and used as a molecular sieve film or a carbon-dioxide separating film.

Further, the single-crystal material may be used as a nano-hole device in the form of a thin film or thick film. Such a thin or thick film may be prepared by cutting and slicing the single-crystal material perpendicularly to the dislocation bundle, using a high-precision diamond cutter.

EXAMPLE

Example 1

As schematically shown in FIG. 5(a), a cubic zirconia single-crystal sample of 5 mm (length)×5 mm (width)×10 mm (height) was compressed using an electrohydraulic compression machine under the conditions that a crosshead speed is a constant value of 0.005 mm/min, an angle between the normal line relative to the principal slip plane (001) face and the compression axis being 55 degree, an atmosphere being normal atmosphere and a temperature being 1300° C., to induce a plastic deformation of 1% (strain$\epsilon$=8.3×10$^{-6}$). A principal slip direction was [110], and a compression direction was [112]. Then, the sample was subjected to a heat treatment at 1300° C. for 1.5 hours. Edge dislocations introduced by the heat treatment after the compression are schematically shown in FIG. 5(b).

Figure 6A:
FIG. 6(a) is a transmission electron micrograph showing edge dislocations before the heat treatment.
Figure 6B:
FIG. 6(b) is a transmission electron micrograph showing edge dislocations after the heat treatment.

The zirconia single crystal having high-density dislocations introduced therein was polished. Then, the single crystal was subjected to an ion thinning process to have a reduced thickness, and the dislocation structure was observed through transmission electron microscopy. FIG. 6 is a transmission electron micrograph taken from a direction parallel to the slip plane, in which the dislocations are indicated as dots. This suggests that the dislocations are arranged in parallel to each other. In order to verify this point, a micrograph taken after the sample was inclined by several degrees is shown as FIG. 6(b). As seen in this micrograph, the respective dislocations are arranged on respective straight lines while penetrating the film. Based on the above data, it was verified that the introduced high-density dislocations are arranged one-dimensionally on respective straight lines in a direction parallel to the slip plane. In Example 1, density of dislocations was $10^9$/cm$^2$.

Further, three samples plastically deformed at 1300° C. to have respective stains of 1%, 3% and 10% were prepared, and an ionic conductivity in the [110] direction was measured in a temperature range of 300 to 642° C. The test result is shown in Table 1 in the form of the change rate of electrical conductivity on the basis of a sample having no plastic deformation. While the ionic conductivity in a zirconia single crystal sample is typically measured at about 1000° C., measured in the above relatively low temperature range, because a great industrial gain can be provided if an adequate ionic conductivity is achieved at a lower temperature.

TABLE 1

Change rate of conductivity on the basis of a sample with no plastic deformation

| Measurement Temperature ° C. | 1% | 3% | 10% |
| --- | --- | --- | --- |
| 300 | +1.35 | −3.93 | +0.62 |
| 301 | +3.17 | −2.90 | +1.85 |
| 354 | +0.99 | −0.44 | +3.68 |
| 406 | +3.12 | +3.01 | +6.87 |
| 456 | +3.16 | +4.48 | +8.01 |
| 504 | +2.87 | +5.34 | +8.19 |
| 551 | +2.55 | +6.72 | +8.52 |
| 597 | +3.10 | +7.46 | +9.14 |
| 642 | +2.56 | +7.51 | +8.14 |
| Ea | +0.09 | +1.34 | +0.90 |

* Ea: activation energy of ionic conduction

From Table 1, it can prove that the value of ionic conductively is increased as the amount of plastic deformation is obviously large. Further, this tendency comes to front in a measurement at a higher temperature. The density of dislocations is increased as the value of deformation is increase. An ionic conductivity in a strain of 10% at 595° C., is increased by 9.14%. The value of ionic conductivity is further increased by additionally increasing the value of deformation.

Example 2

Figure 7A:
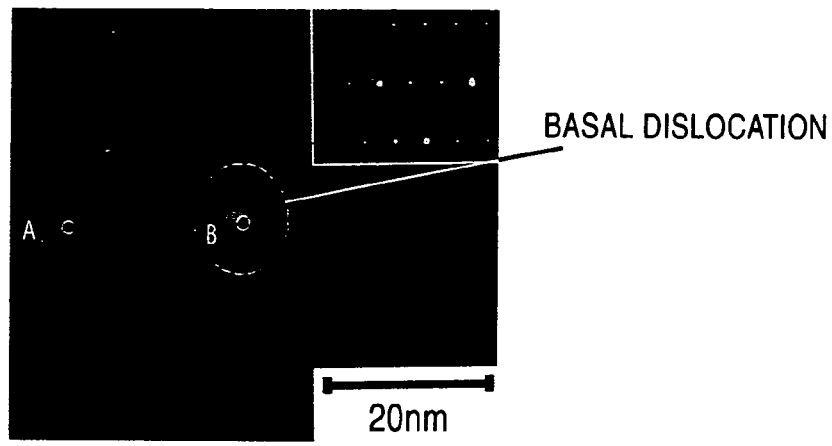
FIG. 7(a) is an energy dispersive spectroscopic (EDS) image.
Figure 7B:
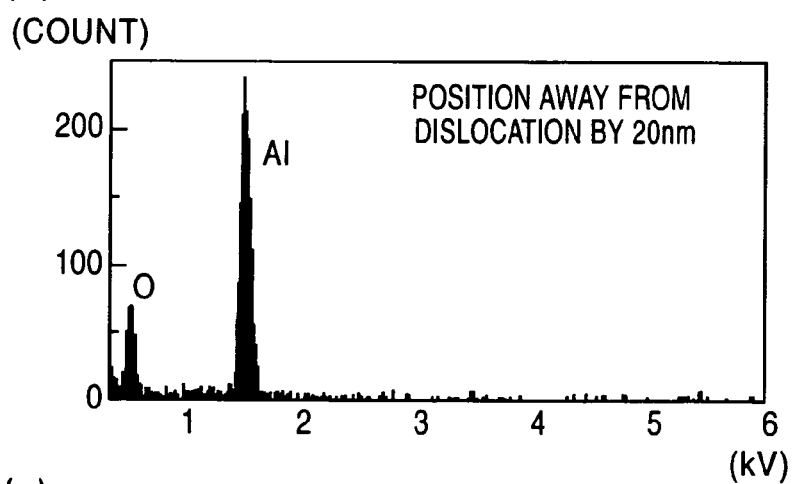
FIG. 7(b) is an EDS spectrum obtained from the zone A in FIG. 7(a).
Figure 7C:
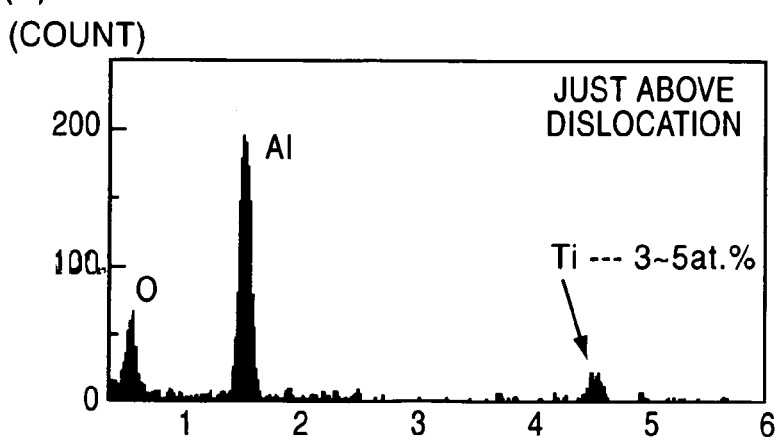
FIG. 7(c) is an EDS spectrum obtained from the zone B in FIG. 7(a).

Under the same conditions as those of Example 1, except for using alumina single crystal (sapphire) as a single crystal sample, dislocations were formed in the sample, and titanium was deposited on the sample through a vacuum deposition process. Then, the deposited titanium was diffused at a temperature of 1400° C. and a pressure of 1 atom or less under an Ar gas atmosphere for 2 hours. FIG. 7(a) is an energy dispersive spectroscopic (EDS) image of the sample after the titanium deposition at a position just above a basal dislocation (circled zone B) and at a position away from the basal dislocation by 20 nm (circled zone A). FIG. 7(b) is an EDS spectrum obtained at a position of the circled zone A, and FIG. 7(c) is an EDS spectrum at a position just above one of the dislocations. The measurement was conducted using a probe with a diameter of 1 nm. As seen in FIG. 7(c), 3 to 5 at % of titanium exists at the position of the dislocation. This means that titanium atoms are evidently introduced in the center of the dislocation.

INDUSTRIAL APPLICABILITY

The present invention can provide a new nanotechnology utilizing dislocations in a single-crystal material, which allows various functional device, such as a device for high-speed dislocation-pipe diffusion of ions or electrons, a quantum wire device, a molecular sieve film or a carbon-dioxide separating film, to be produced at low cost without using any costly complicated means as in conventional techniques.

What is claimed is:

1. A quantum wire device comprising a single-crystal material made of ceramic or metal, said single-crystal material internally having dislocations arranged one-dimensionally on respective straight lines at a high density of $10^6$ to $10^{14}/cm^2$, and quantum wires consisting of metal atoms introduced in said single-crystal material through a diffusion treatment, said quantum wires being arranged along said corresponding dislocations at a high density of $10^6$ to $10^{14}/cm^2$.

2. A thin film device comprising a single-crystal thin film made of ceramic or metal, said thin film internally having dislocations arranged one-dimensionally on respective straight lines at a high density of $10^6$ to $10^{14}/cm^2$, and nano-hole bundle formed along said corresponding dislocations.

3. A method of producing a single-crystal material for a quantum wire device, comprising:

compressing a single-crystal blank made of ceramic or metal, from a direction allowing the activation of a single slip, in a temperature range of a brittle-to-ductile transition temperature to about a melting point of said single-crystal blank to induce plastic deformation therein, and subjecting the resulting product to a heat treatment at a high temperature of one-half or more of said melting point by absolute temperature, to provide a single-crystal material internally having dislocations arranged one-dimensionally on respective straight lines at a high density of $10^6$ to $10^{14}/cm^2$; and subjecting said single-crystal material to a diffusion treatment to diffuse metal atoms from the surface of said single-crystal material to form quantum wires arranged along said corresponding dislocations at a high density of $10^6$ to $10^{14}/cm^2$.

4. A method of producing a single-crystal material for a thin film device, comprising:

compressing a single-crystal blank made of ceramic or metal, from a direction allowing the activation of a single slip, in a temperature range of a brittle-to-ductile transition temperature to about a melting point of said single-crystal blank to induce plastic deformation therein, and subjecting the resulting product to a heat treatment at a high temperature of one-half or more of said melting point by absolute temperature, to provide a single-crystal material internally having dislocations arranged one-dimensionally on respective straight lines at a high density of $10^6$ to $10^{14}/cm^2$; and subjecting said single-crystal material to annealing or chemical etching to form nano-hole bundles along said corresponding dislocations.

* * * * *